United States Patent [19]

Friz

[11] Patent Number: 5,415,946
[45] Date of Patent: May 16, 1995

[54] VAPOR-DEPOSITION MATERIAL FOR THE PRODUCTION OF OPTICAL COATINGS OF MEDIUM REFRACTIVE INDEX

[75] Inventor: Martin Friz, Darmstadt, Germany

[73] Assignee: Merck Patent Gesellschaft mit Beschrankter Haftung, Darmstadt, Germany

[21] Appl. No.: 77,594

[22] Filed: Jun. 17, 1993

[30] Foreign Application Priority Data

Jun. 17, 1992 [DE] Germany .................. 42 19 817.8

[51] Int. Cl.$^6$ .................. B05D 5/06; C07F 5/06; B32B 9/00
[52] U.S. Cl. .................. 428/697; 428/423.1
[58] Field of Search .................. 427/162, 166, 248.1, 427/585; 556/294, 29, 179, 181; 428/423, 697, 703

[56] References Cited

U.S. PATENT DOCUMENTS

| | | | |
|---|---|---|---|
| 4,636,257 | 1/1987 | Baudry | 106/19 |
| 5,082,688 | 1/1992 | Agostinelli et al. | 427/62 |
| 5,096,642 | 3/1992 | Shirasaki | 264/66 |
| 5,137,703 | 8/1992 | Lichtin et al. | 423/239 |
| 5,157,466 | 10/1992 | Char et al. | 427/62 |
| 5,213,911 | 5/1993 | Bloom et al. | 429/33 |
| 5,219,826 | 6/1993 | Kapitulnik | 427/63 |
| 5,219,834 | 6/1993 | Usuki et al. | 427/63 |

FOREIGN PATENT DOCUMENTS 1228489 6/1967 Germany .

Primary Examiner—Janyce Bell
Attorney, Agent, or Firm—Millen, White, Zelano & Branigan

[57] ABSTRACT

The invention relates to a vapor-deposition material for the production of optical coatings of medium refractive index by deposition-coating of substrates in vacuo. The material is a compound of the formula $La_{1-x}Al_{1+x}O_3$ where $x = 0$ to $0.84$.

11 Claims, No Drawings

VAPOR-DEPOSITION MATERIAL FOR THE PRODUCTION OF OPTICAL COATINGS OF MEDIUM REFRACTIVE INDEX

BACKGROUND OF THE INVENTION

Thin oxide coatings are widely used in industry, in particular in optics, as protective coatings or to fulfil optical functions. Thus, they can serve as protection against corrosion and mechanical damage or for anti-reflection coating of the surfaces of optical components and instruments such as, in particular, lenses, mirrors, prisms, etc. Furthermore, thin oxide coatings are used to produce optical coatings of high, medium or low refractive index in order to increase or reduce reflections. The major areas of application are the production of anti-reflection coatings on spectacle lenses and on elements for camera lenses, binoculars and optical components for optical measuring instruments and for laser technology. Other applications involve the production of coatings having a certain refractive index and/or certain optical absorption properties, for interference mirrors, beam dividers, heat filters and diathermic mirrors, for example.

The starting materials for the production of oxide coatings of this type are known per se. The usual materials are $SiO_2$ and a wide range of metal oxides, optionally in combination with one another. Selection is made essentially empirically in accordance with the desired optical properties and processing properties. The coatings are produced by the vacuum vapor deposition technique, which is know per se. An exemplary illustration is given in German Patent 12 28 489 and by H. A. Macleod in "Thin Film Optical Filters, A. Hilger Ltd., Bristol, 1986, which comments on the materials that can be used, processing techniques and the problems encountered.

For the production of coatings of medium refractive index, i.e., coatings which have optical refractive index values of 1.6–1.9, the choice of starting materials which are suitable in principle is limited. Suitable starting materials are essentially the oxides of aluminum, magnesium, yttrium, lanthanum, praseodymium, and cerium fluoride and lanthanum fluoride, and mixed systems thereof. The preferred starting material for coatings of medium refractive index is aluminum oxide.

However, these suitable materials have a number of disadvantages which are evident, in particular, from the practical point of view during processing.

One aspect here is that these substances have high melting and boiling points, which are relatively close to one another. From a practical point of view, however, it is important that the vapor-deposition materials are fully melted before significant deposition begins. Only then is a uniform and adequate deposition rate ensured. This is necessary for the formation of homogeneous and uniformly thick coatings on the objects to be coated. However, such requirements are not met under practical application conditions for the oxides of magnesium and yttrium. These substances do not fully melt or do not melt at all under conventional working conditions. They are difficult to evaporate, and, therefore, coatings having thickness variations are obtained.

Magnesium oxide forms porous coatings into which moisture is easily included, causing the coating to become unstable. The same applies to lanthanum oxide. Cerium fluoride and lanthanum fluoride likewise form inhomogeneous coatings of inadequate hardness and durability.

Attempts have therefore been made to reduce the melting points of the base materials by means of suitable additives. Additives furthermore serve to vary and set the refractive index in the resultant coating within certain limits.

The choice of suitable additives for this purpose is limited by the requirement for freedom from absorption. The only appropriate additives are therefore metal oxides which do not absorb in the near infra-red and in the visible spectral region as far as the near UV wavelength range (to about 200 nm).

Titanium dioxide, praseodymium oxide and neodymium oxide, for example, are unsuitable for this reason.

Although the above mentioned problems can be overcome through a suitable choice of additives or by selecting appropriate mixtures of substances, the use of mixed systems per se in vacuum vapor deposition technology is not preferred. The reason for this is that mixed systems generally evaporate incongruently, i.e., they change their composition during the evaporation process, and the composition of the deposited coatings and thus their refractive index also vary correspondingly. Typical examples of systems exhibiting this disadvantage are tantalum oxide/aluminum oxide and hafnium oxide/aluminum oxide mixed systems.

SUMMARY OF THE INVENTION

An object of the invention is to provide a vapor-deposition material for the production of optical coatings of medium refractive index by the vacuum vapor deposition technique which does not have the disadvantages of the known materials and by means of which, in particular, uniform coatings having a homogeneous composition which do not absorb in the visible region can be produced.

Upon further study of the specification and appended claims, further objects and advantages of this invention will become apparent to those skilled in the art.

Initial considerations suggested that a system based on oxides of lanthanum and aluminum would be interesting in this respect.

However, mixtures of these oxides proved to be unsuitable for handling in practice, since they absorb moisture and become unusable for vacuum evaporation due to irreversible conversion into the hydroxide.

Surprisingly, it has now been found that compounds of the formula $La_{1-x}Al_{1+x}O_3$ where $x=0$ to $0.84$ are highly suitable as vapor-deposition materials for the production of optical coatings of medium refractive index by vacuum evaporation. It has been found that these materials can be evaporated in vacuo without problems and without spitting and readily give homogeneous absorption-free, stable coatings under the working conditions usual in vacuum evaporation technology.

The invention thus relates to a vapor-deposition material for the production of optical coatings of medium refractive index by deposition-coating of substrates in vacuo, where this material is a compound of the formula $La_{1-x}Al_{1+x}O_3$ where $x=0$ to $0.84$.

A particularly preferred vapor-deposition material is a compound which may be characterized by the formula $La_{1-x}Al_{1+x}O_3$ where $x=0$ to $0.6$.

The invention furthermore relates to a process for the production of optical coatings of medium refractive index, in which substrates are deposition-coated in vacuo with a vapor-deposition material of this type.

The vapor-deposition material according to the invention is not a mixture of the two oxides, but instead a mixed oxide compound having a discrete, stoichiometrically defined composition. In these compounds, the molar ratio of lanthanum oxide, $LaO_{1.5}$, and aluminum oxide, $AlO_{1.5}$, is generally 1:1–1:11 and preferably 1:1–1:5. In all these mixed oxide compounds, the oxygen content is precisely stoichiometric.

In the materials according to the invention, no oxygen is released during the vacuum evaporation. The composition range selected is such that absorption-free coatings readily form under the conventional working conditions in vacuum evaporation technology. It has furthermore been found that the optical properties of the resultant coatings are virtually unaffected by variations in the residual oxygen pressure during the vacuum evaporation.

These findings are particularly surprising and unforeseeable.

The vapor-deposition materials according to the invention can be obtained by mixing the oxides of lanthanum and aluminum in the appropriate stoichiometric ratio, for example, in molar ratio of lanthanum oxide to aluminum oxide 1:1–1:11, preferably 1:1–1:5, and sintering the mixture in a high vacuum of, for example, $10^{-3}$ to $10^{-6}$ mbar, preferably $10^{-4}$ to $10^{-5}$ mbar, and below the melting point of each oxide in the mixture. A preparation process of this type for the vapor-deposition materials according to the invention is likewise covered by the invention. The sintered product is in the form of hard, white grains, melts completely from a temperature of about 1800° C. and can be evaporated in a vacuum of about $10^{-4}$ mbar at temperatures of preferably about 2200°–2300° C.

The vapor-deposition material according to the invention can be employed in a known manner in the vacuum vapor-deposition apparatuses and units which are conventional in the relevant technology and under the processing conditions customary therefor. See MacLeod and German Pat. No. 1,229,489 cited above. The vacuum evaporation can be carried out not only by thermal evaporation, but also by electron-beam evaporation.

The deposition can be conducted, e.g., at $O_2$ residual pressure of about $4\times10^{-4}$ to about $8\times10^{-5}$ mbar, preferably $10^{-4}$ to $2\times10^{-4}$ mbar.

The material according to the invention allows the production of homogeneous, thin coatings of uniform thickness and good adhesion which are particularly resistant to mechanical and chemical effects on any suitable substrates. The coatings have a medium refractive index, which, depending on the composition and wavelength at which the measurement is carried out, is, for example, 1.6–1.9, preferably 1.7–1.8. The coatings have high transmission in a wavelength range from the near UV (from about 200 nm) through the visible region as far as the near IR (about 7000 nm) and are free from absorption, in particular in the visible wavelength range.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius and unless otherwise indicated, all parts and percentages are by weight.

The entire disclosures of all applications, patents and publications, cited above and below, and of corresponding application German P 42 19 817.8, are hereby incorporated by reference.

EXAMPLES

Example 1

Preparation

A powder mixture is prepared from
51% by weight of lanthanum(III) oxide and
49% by weight of aluminum(III) oxide
and this mixture is granulated. The composition is selected so that a compound of the formula $La_{0.5}Al_{1.5}O_3$ forms.

The granules are sintered for from 3 to 8 hours in a high vacuum ($10^{-4}$ mbar) at a temperature of from 1600° to 1680° C. The white product obtained has a melting point of 1930° C.

Example 2

Preparation

A powder mixture is prepared from
76% by weight of lanthanum(III) oxide and
24% by weight of aluminum(III) oxide
and this mixture is granulated. The composition is selected so that a compound of the formula $LaAlO_3$ forms.

The granules are sintered for from 3 to 8 hours in a high vacuum ($10^{-4}$ mbar) at a temperature of from 1600° to 1680° C. The white product obtained has a melting point of 1850° C.

Example 3

Use

The granules from Example 1 are introduced into a copper evaporation crucible and introduced into a commercially available vacuum vapor-deposition apparatus with electron-beam evaporation.

The substrate to be deposition-coated comprises quartz or glass.

The coating is carried out at a temperature of from 2200° to 2300° C. and at a residual $O_2$ pressure of $2\times10^{-4}$ mbar at a substrate temperature of 250° C. and at a deposition rate of 0.4 nm/sec until a coating thickness of 250 nm has been achieved.

The coating has a refractive index at 500 nm of $n=1.7$. The coating has no absorption in the visible region and up to a wavelength of about 200 nm.

Analogous processing of the granules from Example 2 gives a coating having a refractive index at 500 nm of $n=1.8$.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A process for the preparation of a vapor-deposition material comprising a compound of the formula $La_1$-

$xAl_{1+x}O_3$, where $x=0$ to 0.84, which is useful for the production of optical coatings of medium refractive index by deposition coating of substrates in a vacuum, comprising:

mixing oxides of lanthanum and aluminum in a molar ratio of lanthanum oxide to aluminum oxide of from 1:1 to 1:11, and sintering the mixture in a high vacuum of $10^{-3}$ to $10^{-6}$ mbar at a temperature below the melting point of the oxides in the mixture.

2. The process of claim 1, wherein vapor-deposition materials of the formula $La_{1-x}Al_{1+x}O_3$, where $x=0$ to 0.6 are prepared.

3. The process of claim 1, wherein the oxide of lanthanum is $La_2O_3$ and the oxide of aluminum is $Al_2O_3$.

4. The process of claim 1, wherein the high vacuum is $10^{-4}$ to $10^{-5}$ mbar.

5. A process for the production of an optical component having an optical coating of medium refractive index which comprises:

vapor-depositing a material comprising a compound of the formula $La_{1-x}Al_{1+x}O_3$, where $x=0$ to 0.84, onto a surface of an optical component in a vacuum to produce a coating thereon.

6. The process of claim 5, wherein $x=0$ to 0.6.

7. The process of claim 5, wherein said material is evaporated prior to vapor depositing by thermal evaporation.

8. The process of claim 5, wherein said material is evaporated prior to vapor depositing by electron-beam evaporation.

9. The process of claim 5 wherein the refractive index of the optical coating is from 1.6 to 1.9.

10. An optical component having an optical coating thereon comprising a vapor deposition material comprising a compound of the formula $La_{1-x}Al_{1+x}O_3$, where $X=0$ to 0.84, said optical coating having a refractive index of 1.6-1.9.

11. The optical component of claim 10 wherein the optical coating thereon has refractive index of 1.7-1.8.

* * * * *